United States Patent
Yoon et al.

(10) Patent No.: US 8,202,788 B2
(45) Date of Patent: Jun. 19, 2012

(54) METHOD FOR FABRICATING GANASSB SEMICONDUCTOR

(75) Inventors: Soon Fatt Yoon, Singapore (SG); Kian Hua Tan, Singapore (SG); Wan Khai Loke, Singapore (SG); Satrio Wicaksono, Singapore (SG); Tien Khee Ng, Singapore (SG)

(73) Assignee: Nanyang Technological University, Singapore (SG)

(*) Notice: Subject to any disclaimer, the term of this patent is extended or adjusted under 35 U.S.C. 154(b) by 0 days.

(21) Appl. No.: 12/936,495

(22) PCT Filed: Jun. 26, 2008

(86) PCT No.: PCT/SG2008/000225
§ 371 (c)(1),
(2), (4) Date: Oct. 5, 2010

(87) PCT Pub. No.: WO2009/157870
PCT Pub. Date: Dec. 30, 2009

(65) Prior Publication Data
US 2011/0039400 A1    Feb. 17, 2011

(51) Int. Cl.
*H01L 21/20* (2006.01)

(52) U.S. Cl. .......... 438/492; 438/502; 117/11; 117/103; 257/E21.09; 257/E21.117

(58) Field of Classification Search .......... 438/492, 438/493, 502, 503, 504, 505, 506, 507, 508, 438/509; 117/11, 54, 56, 63, 74, 103, 154, 117/105; 257/E21.09, E21.093, E21.097, 257/E21.11, E21.108, E21.117, E21.126, 257/E21.133, E21.138
See application file for complete search history.

(56) References Cited

U.S. PATENT DOCUMENTS 6,798,809 B1* 9/2004 Gambin et al. ............ 372/45.01
2005/0220391 A1* 10/2005 Hashimoto et al. ............ 385/14

OTHER PUBLICATIONS

Harmand et al., "GaNAsSb: How does it compare with other dilute III-V-nitride alloys?" *Semiconductor Science and Technology* (2002) 17: 778-784.
Tan et al., "1.55 μm GaAs/GaNAsSb/GaAs optical waveguides grown by radio frequency nitrogen plasma-assisted molecular beam epitaxy," *Applied Physics Letters* (2008) 92: 13513-1-13513-3.
Yuen, H.B., "Growth and characterization of dilute nitride antimonides for long-wavelength optoelectronics," *PhD Thesis, Stanford University* (Mar. 2006).
Fischer et al., "GaInNAs for GaAs based lasers for the 1.3 to 1.5 μm range," *Journal of Crystal Growth* (2003) 251: 353-359.
Wistey et al., "Nitrogen plasma optimization for high-quality dilute nitrides," *Journal of Crystal Growth* (2005).278: 229-233.

* cited by examiner

*Primary Examiner* — Julio J Maldonado
*Assistant Examiner* — Su Kim
(74) *Attorney, Agent, or Firm* — Merchant & Gould P.C.

(57) ABSTRACT

Disclosed is a method for fabrication of a semiconductor of gallium nitride arsenide antimonide (GaNAsSb) on a substrate wherein the fabrication is performed at a fabrication temperature followed by annealing at an annealing temperature for an annealing time; wherein at least one of: the fabrication temperature, annealing temperature and annealing time, is controlled for controlling defect formation in the semiconductor so as to achieve predetermined performance characteristics of the semiconductor.

13 Claims, 10 Drawing Sheets

METHOD FOR FABRICATING GANASSB SEMICONDUCTOR

This application is a National Stage Application of PCT/SG2008/000225, filed Jun. 26, 2008, and which application is incorporated herein by reference. To the extent appropriate, a claim of priority is made to each of the above disclosed applications.

TECHNICAL FIELD

The present invention relates to a method for growing a dilute nitride gallium nitride arsenide antimonide (GaNAsSb) semiconductor on a substrate.

BACKGROUND

Previously, III-V materials with a bandgap lower than 1.0 electronvolt (eV) could only be realised on indium phosphide (InP) substrates. However, gallium arsenide (GaAs) substrates are preferred to InP substrates from both a technical and economic perspective. The aluminium gallium arsenide/gallium arsenide (AlGaAs/GaAs) mirror system has higher refractive index difference and better thermal dissipation than the gallium indium arsenide phosphide/indium phosphide (GaInAsP/InP) mirror system. GaAs substrates are also known to be more robust and inexpensive compared to InP substrates. In addition, the small difference in lattice constant between GaAs and germanium (Ge) (~0.04%) and the recent availability of Ge-terminated Si substrates using graded silicon germanium (SiGe) buffer layers have opened up the possibility of integrating III-V devices on silicon (Si) substrates. These advantages and the potential of GaAs-based processes have fuelled a need for small bandgap materials that can be grown lattice-matched to the GaAs substrate.

In 1992, it was found that incorporation of a small amount of nitrogen (0% to 4%) into GaAs resulted in a reduction of the bandgap and lattice constant in GaAsN. This was unusual at that time as bandgap reduction by addition of other atoms, such as indium or antimony, to GaAs was expected to increase its lattice constant. The reduction of bandgap on addition of nitrogen was explained by the band anti-crossing model, where introduction of nitrogen atoms results in a nitrogen-related state above the conduction band minima. This nitrogen-related state splits the conduction band and reduces the conduction band minima, which results in a reduction of the bandgap energy.

The application of GaNAsSb material for near infrared applications was first proposed in 1999. GaNAsSb can be lattice-matched to GaAs by keeping the ratio of the antimony content to the nitrogen content at approximately 2.6:1. In addition, the bandgap of GaNAsSb can be lowered to the near infrared region by increasing the nitrogen concentration. Antimony was also found to have a surfactant effect in dilute-nitride growth. This surfactant effect encourages the incorporation of nitrogen atoms into substitutional sites and thereby prevents formation of nitrogen related defects. Furthermore, the GaNAsSb material offers flexibility for independent tuning of the conduction band offset and valence band offset. In particular, the conduction band offset can be tuned by varying the nitrogen content, while the valence band offset can be tuned by varying the antimony content. This gives the ability to engineer the bandgap for electronic and optoelectronic device applications.

There are, however, shortcomings in GaNAsSb when prepared using conventional methods. For instance, the nitrogen plasma ignition process damages the surface of the semiconductor prior to growth of GaNAsSb due to unstable plasma conditions at the ignition stage. Energetic bombardment of reactive ion species in the nitrogen plasma onto the GaNAsSb surface during growth also contributes to defect creation. Additionally, due to the presence of arsenic antisite defects and nitrogen related defects, carrier recombination centres are created inside the bandgap. This reduces the carrier lifetime of the GaNAsSb and compromises its luminescence. Furthermore, high unintentional doping (i.e. greater than $1 \times 10^{17}$ per cubic centimeter) caused by the presence of nitrogen-related defects, with an energy level of about 0.1 eV above the valence band, limits the application of GaNAsSb for photon absorption. Photon absorption requires a thick depletion region, and a high unintentional doping leads to a counteractive effect. Also, the presence of arsenic antisite defects and nitrogen-related defects promote trap-assisted tunnelling in a reverse-biased GaNAsSb—GaAs p-n junction, leading to high leakage current (i.e. greater than 10 amperes per square centimeter).

In addition, dilute nitride materials (with less than 4% of nitrogen) are known to exhibit poor material quality, resulting in poor device performance.

SUMMARY

According to an exemplary aspect there is provided a method for fabrication of a semiconductor of gallium nitride arsenide antimonide (GaNAsSb) on a substrate wherein the fabrication is performed at a fabrication temperature followed by annealing at an annealing temperature for an annealing time; wherein at least one of:

the fabrication temperature, annealing temperature and annealing time, is controlled for controlling defect formation in the semiconductor so as to achieve predetermined performance characteristics of the semiconductor.

The defect may be at least one of: arsenic antisite defects, nitrogen-related defects, surface defects, unintentional doping.

The method may further comprise growing epitaxial layers of GaAsSb on a substrate and subjecting the epitaxial layers to exposure of nitrogen atoms from a nitrogen plasma source. The epitaxial layers may be isolated from the nitrogen plasma source during plasma ignition. The epitaxial layers may also, be isolated from the nitrogen plasma source during stabilization of the nitrogen plasma source. The nitrogen plasma source may be a nitrogen RF-plasma source. Isolation may be by vacuum isolation using at least one vacuum valve.

The annealing may be one of: in-situ annealing, and in-situ annealing in combination with ex-situ annealing. In-situ annealing may have the annealing temperature in the range 600° C. to 700° C. Ex-situ annealing may have the annealing temperature in the range: 700° C. to 900° C. The annealing time may be in the range 1 to 60 minutes for in-situ annealing. The annealing time may be in the range 1 to 10 minutes for ex-situ annealing.

The fabrication temperature may be in the range 150° C. to 500° C.

The method may further comprise filtering reactive ionic nitrogen species by diversion at a location between the nitrogen plasma source and the substrate. Diversion may be by applying a field across a plasma tube adjacent an outlet of the nitrogen plasma source.

The field may be selected from: an electrical field, and a magnetic field. A voltage may be applied across the plasma tube using a pair of deflection plates. The electrical field may be substantially perpendicular to a longitudinal axis of the plasma tube.

According to another exemplary aspect there is provided a method for fabrication of a semiconductor of gallium nitride arsenide antimonide (GaNAsSb), the method comprising:

growing epitaxial layers of gallium arsenide antimonide (GaAsSb) on a substrate and subjecting the epitaxial layers to exposure of nitrogen atoms from a nitrogen plasma source;

the epitaxial layers being isolated from the nitrogen plasma source during plasma ignition.

The epitaxial layers may also be isolated from the nitrogen plasma source during stabilization of the nitrogen plasma source. The nitrogen plasma source may be a nitrogen RF-plasma source. Isolation may be by vacuum isolation using at least one vacuum valve.

The nitrogen plasma epitaxy process used may lead to an improvement in the material quality and enhancement in device performance.

Advantageously, the invention provides solutions to target specifically the high defect density in the GaNAsSb material prepared using conventional processes.

BRIEF DESCRIPTION OF THE DRAWINGS

Exemplary embodiments will now be described by way of non-limitative example only and with reference to the accompanying illustrative drawings.

In the drawings.

DETAILED DESCRIPTION OF EXEMPLARY EMBODIMENTS

The detailed description set forth below in connection with the appended drawings is intended as a description of the presently exemplary embodiments of the invention, and is not intended to represent the only form in which the present invention may be practiced. It is to be understood that the same or equivalent functions may be accomplished by different embodiments that are intended to be encompassed within the scope of the invention.

Figure 1:
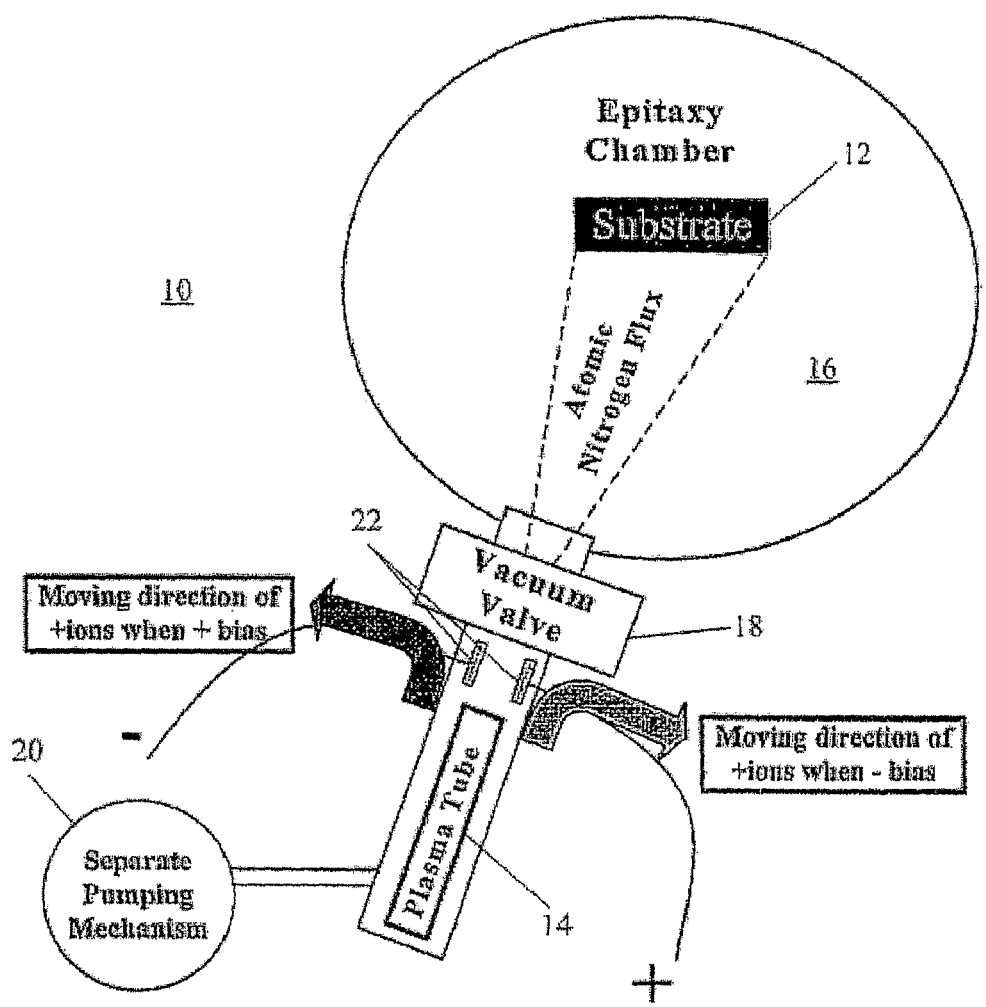
FIG. 1 is a schematic diagram of an exemplary apparatus for growing gallium nitride arsenide antimonide (GaNAsSb) on a substrate.

Referring now to FIG. 1, an exemplary apparatus 10 for growing gallium nitride arsenide antimonide (GaNAsSb) on a substrate 12 is shown. The apparatus 10 includes a plasma source 14 operatively connected to a chamber 16. The plasma source 14 is separated from the chamber 16 by a valve 18. Although only one valve 18 is shown, any number of suitable valves may be used. The valve or valves 18 may be of any suitable category such as, for example, a vacuum valve. If multiple valves are used they may operate simultaneously, or in a staggered manner. A pumping mechanism 20 is coupled to the plasma source 14 and an ion deflection mechanism 22 is provided at a location between the substrate 12 and the plasma source 14, preferably between the plasma source 14 and the chamber 16.

The substrate 12 may be any suitable substrate of any suitable material such as, for example, GaAs, InP, Si, SiGe or Ge.

The plasma source 14 generates atomic nitrogen (N) for the growth of GaNAsSb. In an exemplary embodiment, the atomic nitrogen used in the growth of GaNAsSb is generated by a radio frequency (RF) plasma source. Compared to other plasma sources, the RF plasma source gives lower ion energy and smaller ion flux. For instance, reactive ion plasma has ion energy in a range from 35 to 90 electronvolts (eV) and ion flux of between $3 \times 10^{14}$ and $3 \times 10^{15}$ per square centimeter per second ($cm^{-2} s^{-1}$) at the substrate. For an RF plasma source, the ion flux at the substrate is lower at about $1.1 \times 10^{12} cm^{-2} s^{-1}$ compared to that of reactive ion plasma. Also, the ion energy is lower at 10 eV compared to that, for example, of electron cyclotron resonance (ECR) plasma. Thus, the RF plasma source is a preferred atomic nitrogen source for dilute nitride growth. Nonetheless, it will be understood by those of ordinary skill in the art that the invention is not limited to RF plasma sources and other plasma sources may be used.

The valve 18 is used to achieve physical separation of the nitrogen RF plasma source 14 from the epitaxial growth chamber 16 before and after GaNAsSb growth. In particular, the valve 18 is closed to achieve physical separation of the plasma source 14 and the chamber 16 during ignition of the nitrogen plasma source 14, and preferably, during stabilization of the nitrogen plasma source 14. This may be, for example, for 1 minute and 30 minutes respectively. However, the times may vary according to the specific conditions and apparatus used. Upon plasma ignition being completed and, preferably, after stabilization of the nitrogen plasma source 14, the valve 18 is opened for nitrogen growth to take place. Advantageously, no growth interruption time is required with the use of valves for physical separation. Long interruption time during growth is undesirable as this will deteriorate the interface quality due to impurity accumulation. Physical isolation of the plasma source 14 from the epitaxial growth chamber 16 may be implemented using various types of vacuum isolation valves including, for example, a gate valve, a leak valve or a needle valve.

The pumping mechanism 20 may comprise any suitable pump or pumps and may be, for example, a combination of mechanical and turbo pumps.

When the nitrogen growth is finished, the valve 18 will be closed before the plasma source 14 is stopped. When the valve 18 is closed, the plasma source is stopped.

Reactive ionic species are the most energetic elements in RF plasma. Their bombardment of the semiconductor surface causes dislocation of atoms on the semiconductor surface and defects generation. Accordingly, an ion deflection mechanism 22 may be used to divert the reactive ionic nitrogen species away from the substrate 12. The ion deflection mechanism 22 may be implemented using an electric and/or magnetic field. Electric or magnetic field applications are able to filter the reactive ionic nitrogen species by diverting them away from the substrate 12. In this manner, the ion deflection mechanism 22 filters away energetic ions that damage the substrate surface, whilst allowing nitrogen atoms to arrive at the substrate surface. An example of an ion deflection mechanism 22 employing an electric field will now be described below with reference to FIG. 2.

Figure 2:
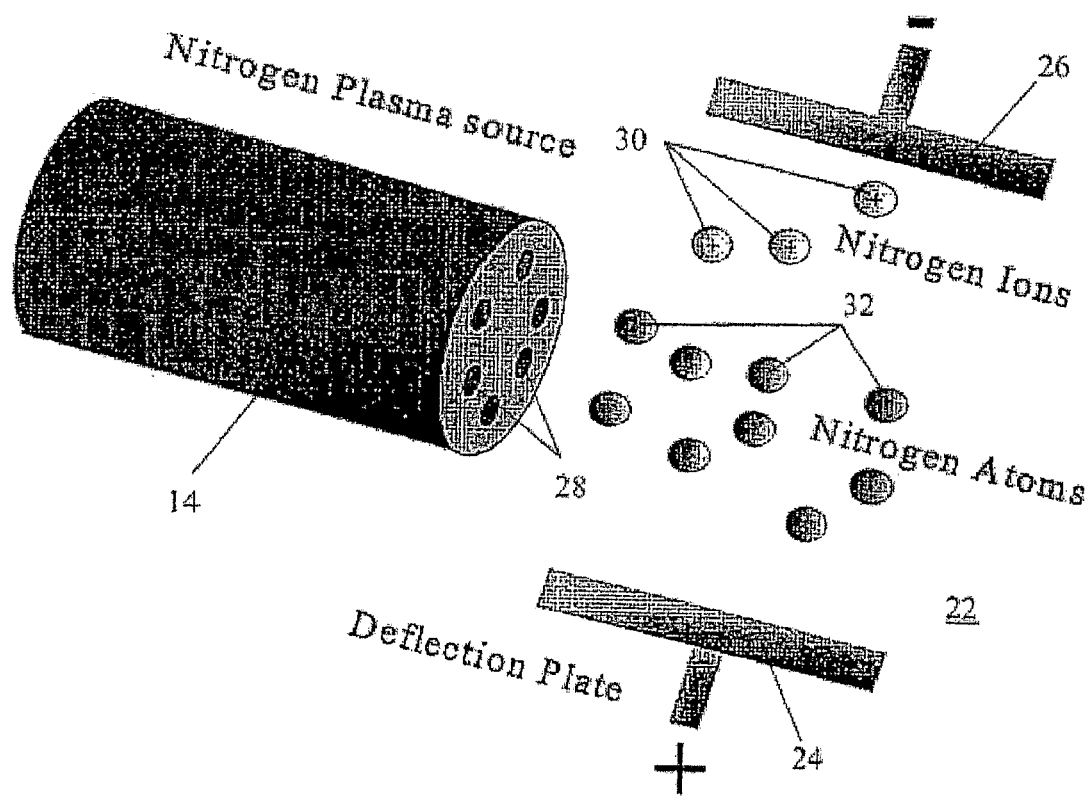
FIG. 2 is a schematic diagram of an exemplary ion deflection mechanism.

Referring now to FIG. 2, an ion deflection mechanism 22 comprising a pair of electrical ion deflection plates 24 and 26 installed in front of an orifice 28 of the nitrogen plasma source 14 is shown. Although one pair of deflection plates 24, 26 is shown, there may be more than one pair of deflection plates, and multiple pairs of deflection plates may be used. The different pairs of deflection plates may be at different voltages. The pair of electrical ion deflection plates 24 and 26 includes a positively charged plate 24 and a negatively charged plate 26. An electric field is created between the positively and negatively charged plates 24 and 26. As shown in FIG. 2, nitrogen atoms 32 emitted from the plasma source 14 are unaffected by the presence of the electric field and continue to the substrate 12. Positively charged nitrogen ions 30 emitted from the plasma source 14 however are attracted to the negatively charged plate 26 and are consequently diverted in a direction perpendicular to the flux of the nitrogen atoms 32. This reduces the incidence of nitrogen ions 30 arriving at the semiconductor surface as the bulk of the nitrogen ions are diverted towards the walls of the epitaxial growth chamber 16. The electrical ion deflection plates 24 and 26 may be made of stainless steel and powered by a DC voltage source, which can be varied from 10 to 60 volts (V). However, the value of voltages may vary according to the specific conditions and apparatus used.

Figure 3:
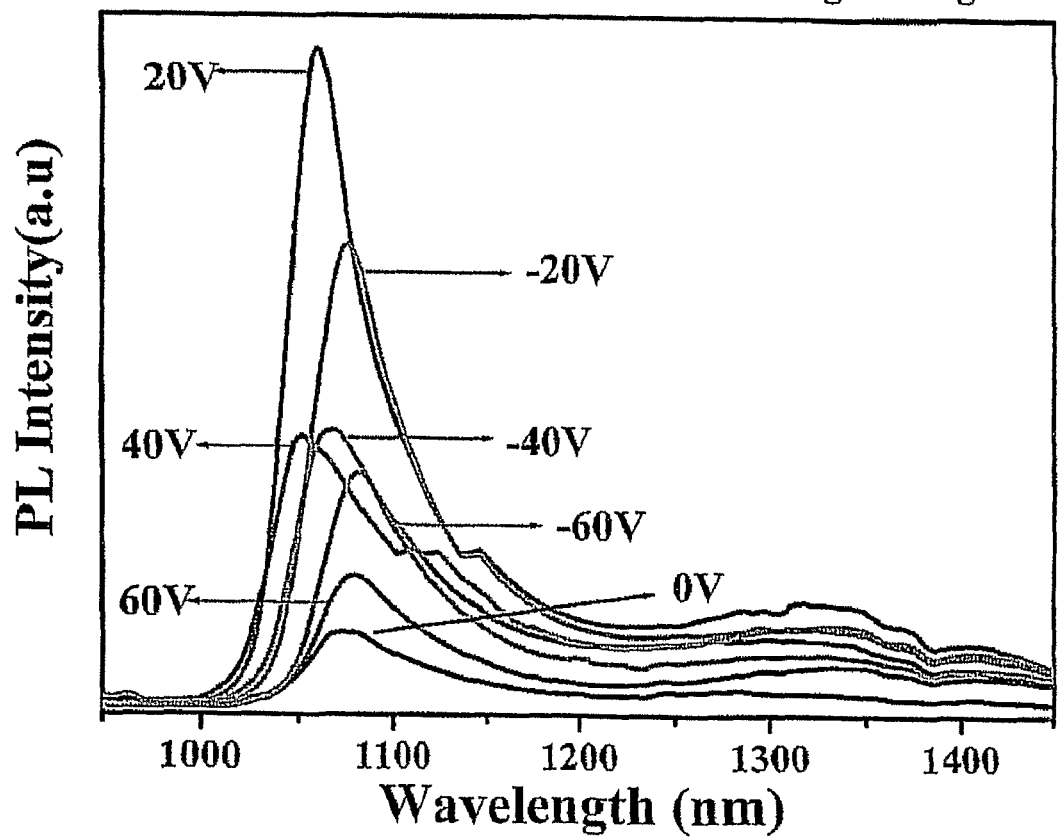
FIG. 3 is a schematic representation of photoluminescence ("PL") spectra of GaNAs samples grown by applying a range of different bias voltages to the exemplary ion deflection mechanism of FIG. 2.

Referring now to FIG. 3, a schematic representation of photoluminescence (PL) spectra of GaNAs samples grown by applying a range of different bias voltages to the electrical ion deflection plates 24 and 26 of the ion deflection mechanism 22 is shown. As can be seen from the results of the PL analysis in FIG. 3, the best material quality is achieved by applying a bias voltage of 20 V to the electrical ion deflection plates 24 and 26.

Having described the various components of the apparatus 10 in one embodiment of the present invention, the operation of these components will now be described in greater detail below with reference to FIGS. 1 and 4.

Figure 4:
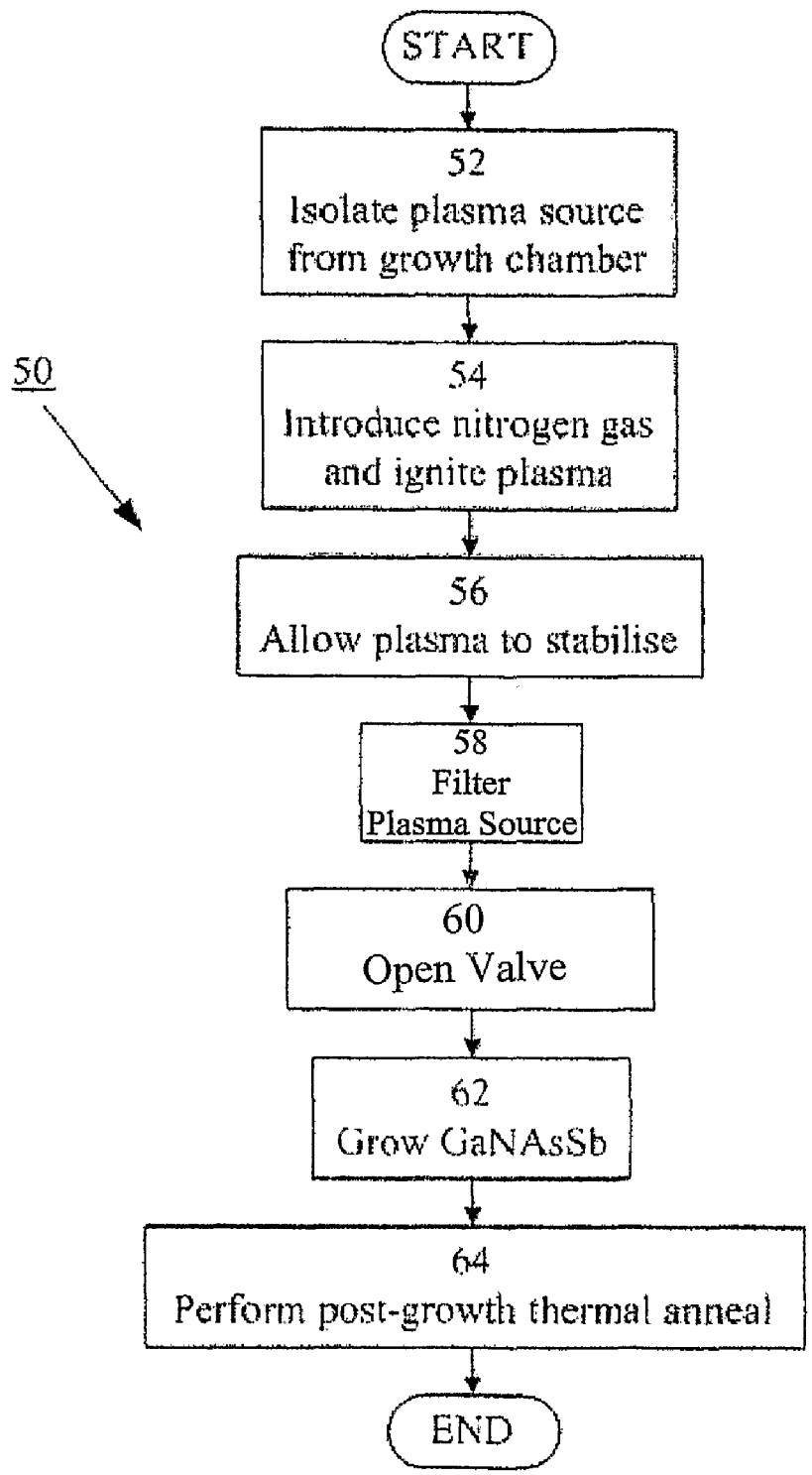
FIG. 4 is a schematic flow diagram of an exemplary method for growing gallium nitride arsenide antimonide (GaNAsSb)

Referring now to FIG. 4, a schematic flow diagram of a method 50 for growing gallium nitride arsenide antimonide (GaNAsSb) is shown.

As nitrogen RF plasma is highly unstable at the ignition stage, the method 50 begins at step 52 by physically isolating the plasma source 14 from the chamber 16 to prevent exposure of the growth surface to unstable plasma conditions during the plasma ignition stage. More particularly, the plasma tube is pumped down to a vacuum level of less than about $1\times10^{-5}$ Pascal (Pa) (about $1\times10^{-7}$ torr) and the valve 18 is closed.

At step 54, high purity nitrogen gas is introduced into the plasma tube and the RF plasma is ignited.

The plasma is allowed to stabilise at step 56 for a period of at least 30 minutes (min) before initiating growth. The pumping mechanism 20 is used to maintain high vacuum in the plasma tube during the plasma stabilisation phase. The nitrogen plasma emitted from the plasma source 14 is filtered at step 58 with the ion deflection mechanism to divert reactive ionic nitrogen species away from the substrate 12. The ion deflection mechanism 22 may be activated while the nitrogen RF plasma source 14 is being prepared.

At step 60, the valve 18 is opened. Dilute nitride growth is started when isolation between the plasma source 14 and the epitaxial growth chamber 16 is removed by opening the valve 18. In one embodiment, the growth of GaNAsSb is started 3 seconds (s) after opening the valve 18.

Figure 5A:
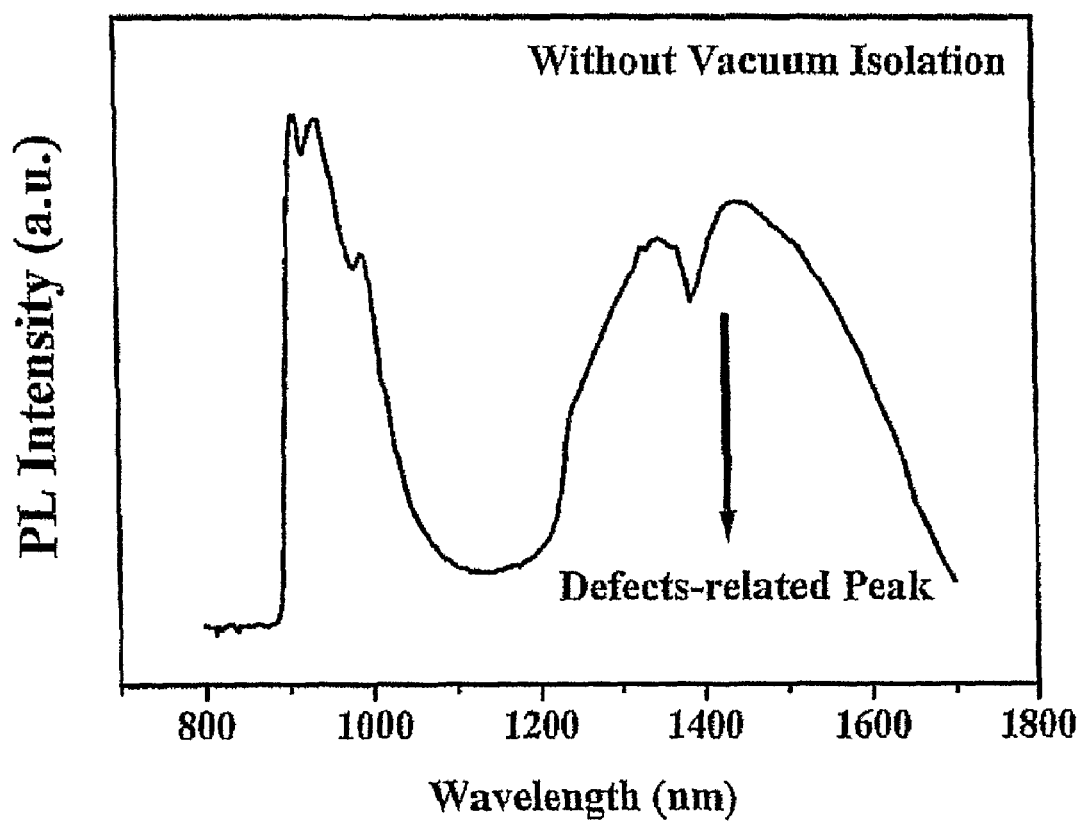
FIG. 5A is a schematic representation of a PL spectrum of GaNAs samples grown without isolating the plasma source from the epitaxial growth chamber.
Figure 5B:
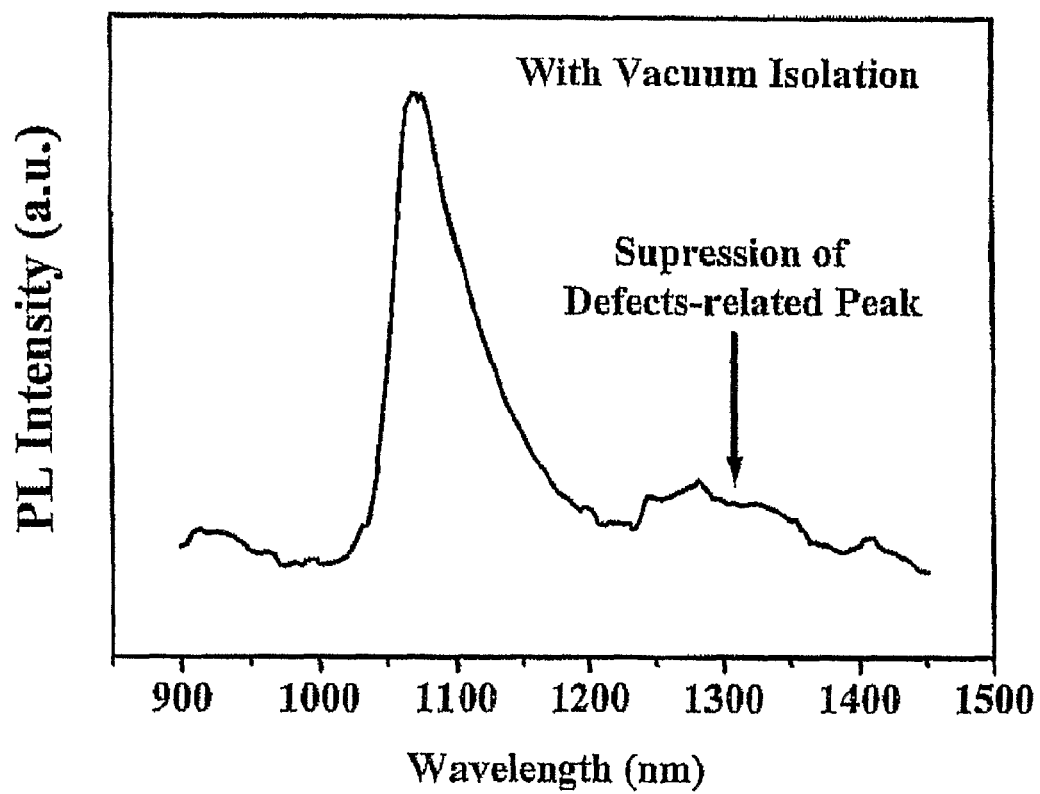
FIG. 5B is a schematic representation of a PL spectrum of GaNAs samples grown with vacuum isolation of the plasma source from the epitaxial growth chamber.

Referring now to FIGS. 5A and 5B, schematic representations of photoluminescence (PL) spectra of GaNAs samples grown without and with vacuum isolation of the RF plasma source 14 from the epitaxial growth chamber 16 are shown. As can be seen from FIGS. 5A and 5B, the PL peak caused by defects is significantly suppressed when the nitrogen RF plasma is physically isolated from the epitaxial growth chamber 16 during plasma ignition. In other words, the defects level is significantly reduced when the isolation mechanism is used.

Although gallium arsenide (GaAs) and gallium arsenide antimonide (GaAsSb) are typically grown at substrate temperatures of about 600° C. to minimize defect density. However, at such substrate temperatures, the addition of nitrogen seriously compromises the quality of the GaNAsSb material. At substrate temperatures of about 600° C., nitrogen atoms arriving at the semiconductor surface gain energy through heat transfer. These energetic nitrogen atoms have high surface mobility. Consequently, they migrate along the semiconductor surface and combine with other nitrogen atoms. Nitrogen related defects are formed when two nitrogen atoms combine and these defects increase the incidence of unintentional doping, shorten carrier lifetime and increase current leakage. Accordingly, to reduce nitrogen related defects, GaNAsSb is grown at step 62 at lower substrate temperatures of between about 150 to about 500 degrees Celsius (° C.). At this lower range of substrate temperatures, the nitrogen atoms acquire less energy from the heat transfer process. This reduces surface migration, which translates into fewer nitrogen related defects.

The nitrogen concentration may be controlled by adjusting the power of RF plasma and gas flow rate of nitrogen gas. The antimony concentration is controlled by changing the antimony flux, via adjusting the valve opening at the valved antimony source.

Upon achieving the desired GaNAsSb layer thickness, the growth process is terminated by closing the valve 18 to physically isolate the nitrogen RF plasma source 14 from the epitaxial growth chamber 16. Termination of the growth of the GaNAsSb layer by simply closing the vacuum valve 18 provides precise control of the interface. This also eliminates the residual nitrogen in the layers and ensures that high vacuum conditions are always maintained in the growth of subsequent layers, which is critical for minimizing contamination of the sample.

Figure 6:
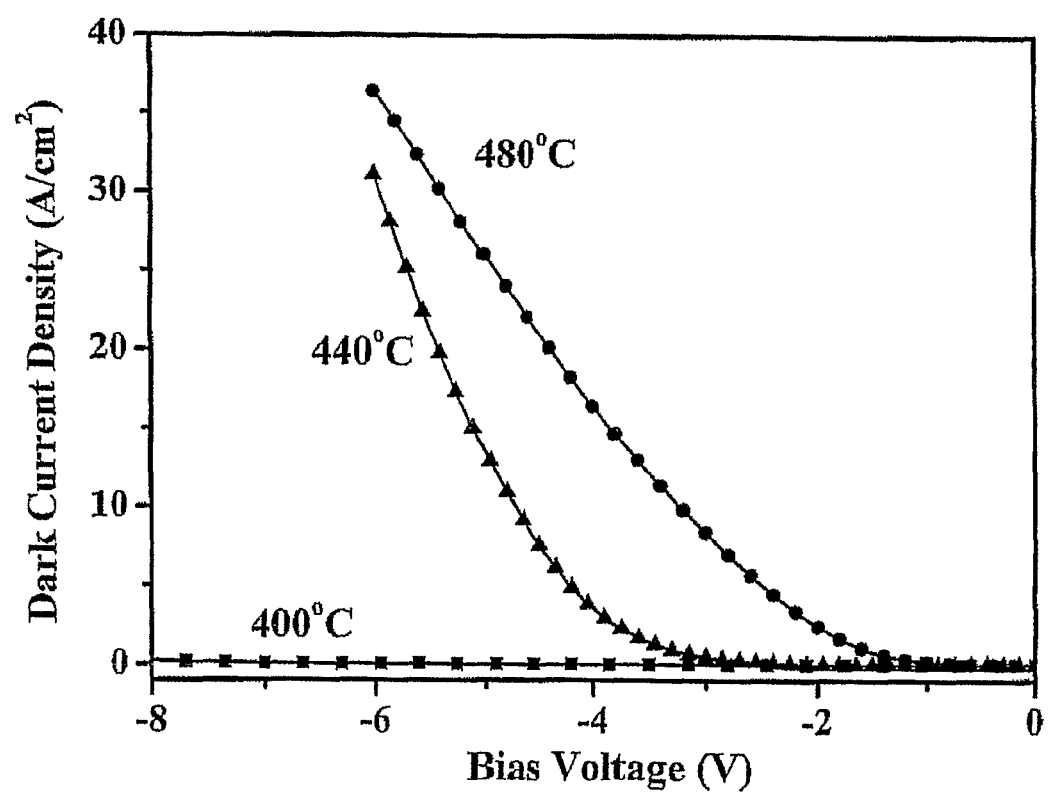
FIG. 6 is a schematic representation of a plot of dark current density as a function of bias voltage for p-i-n photodetectors with i-layers of undoped GaNAsSb material grown at three different substrate temperatures.
Figure 7:
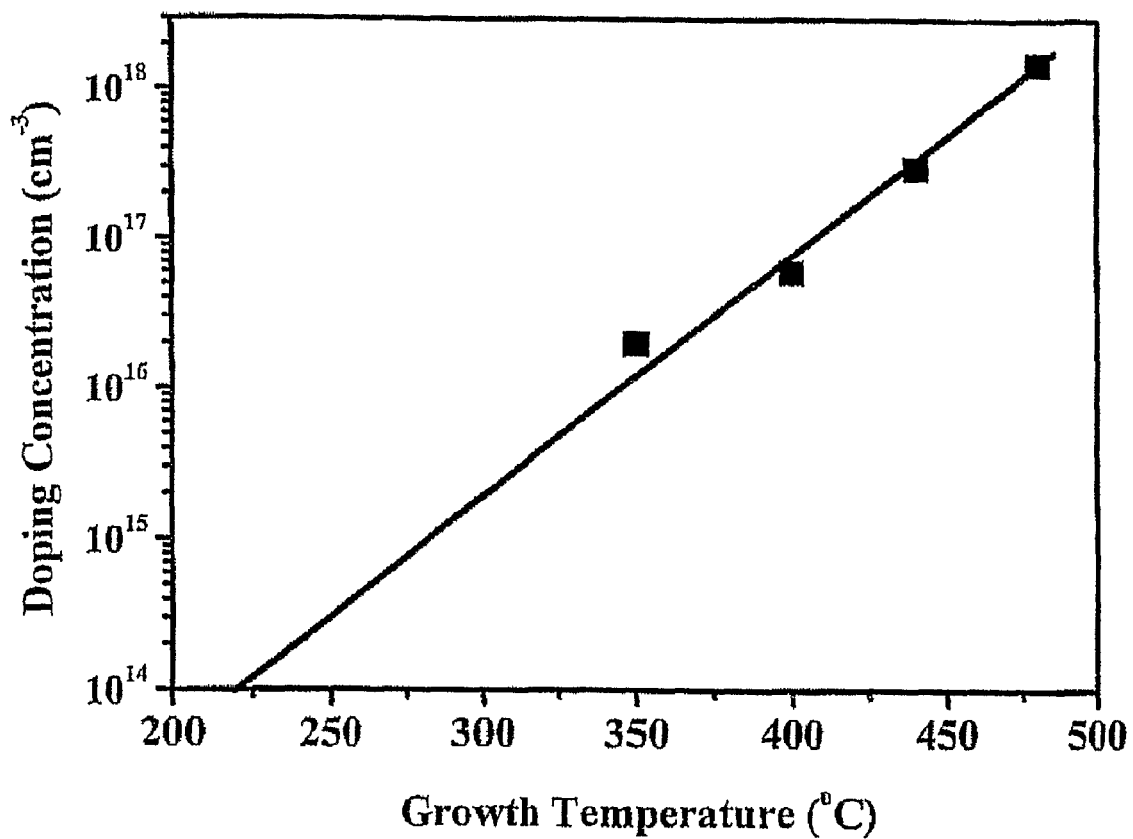
FIG. 7 is a schematic representation of the level of unintentional doping in an i-GaNAsSb material as a function of substrate temperature.

Referring now to FIGS. 6 and 7, a schematic representation of a plot of dark current density as a function of bias voltage for p-i-n photodetectors with i-layers of undoped GaNAsSb material grown at three different substrate temperatures is shown in FIG. 6 and a schematic representation of the level of unintentional doping in the i-GaNAsSb material as a function of substrate temperature is shown in FIG. 7. The doping concentrations in FIG. 7 were measured by capacitance-voltage (C-V) analysis. As can be seen from FIGS. 6 and 7, leakage current and the level of unintentional doping are reduced at lower substrate temperatures due to fewer nitrogen related defects at such substrate temperatures.

Referring again to FIGS. 1 and 4, as substrate temperatures decrease, however, the density of arsenic antisite defects increases. Accordingly, a post-growth thermal anneal is performed at step 64 to reduce arsenic antisite defects. The post-growth thermal anneal may be performed in-situ and/or ex-situ.

In-situ thermal anneal is carried out inside the epitaxial growth chamber 16 immediately after the growth of the GaNAsSb material under constant overpressure arsenic flux at beam equivalent pressure of greater than about 0.001 Pa (about $6\times10^{-6}$ torr). However, the value of beam equivalent pressure of arsenic flux may vary according to the specific conditions and apparatus used. For in-situ thermal annealing, the substrate temperature is increased to about 650° C. and maintained at this temperature for a period of about 30 minutes before cooling naturally. As such, the GaNAsSb material is annealed at a temperature of about 650° C. for a period of about 30 minutes.

Ex-situ thermal anneal is carried out outside the epitaxial growth chamber 16 under a nitrogen ambient for a period of between about 1 to 10 minutes (min) after the sample is removed from the epitaxial growth chamber 16. Besides nitrogen, other gases, such as hydrogen, helium, neon, argon, krypton, xenon or mixture of them, can also be applied as the ambient gas in the annealing process. A protective layer of $SiO_2$ or $Si_3N_4$ may be deposited on the wafer. The protective layer is deposited before placing the samples into chamber of rapid thermal annealing tool. During the ex-situ thermal anneal process, proximity capping with a GaAs wafer may be used to ensure thermal uniformity and to minimise surface damage due to arsenic evaporation.

Figure 8:
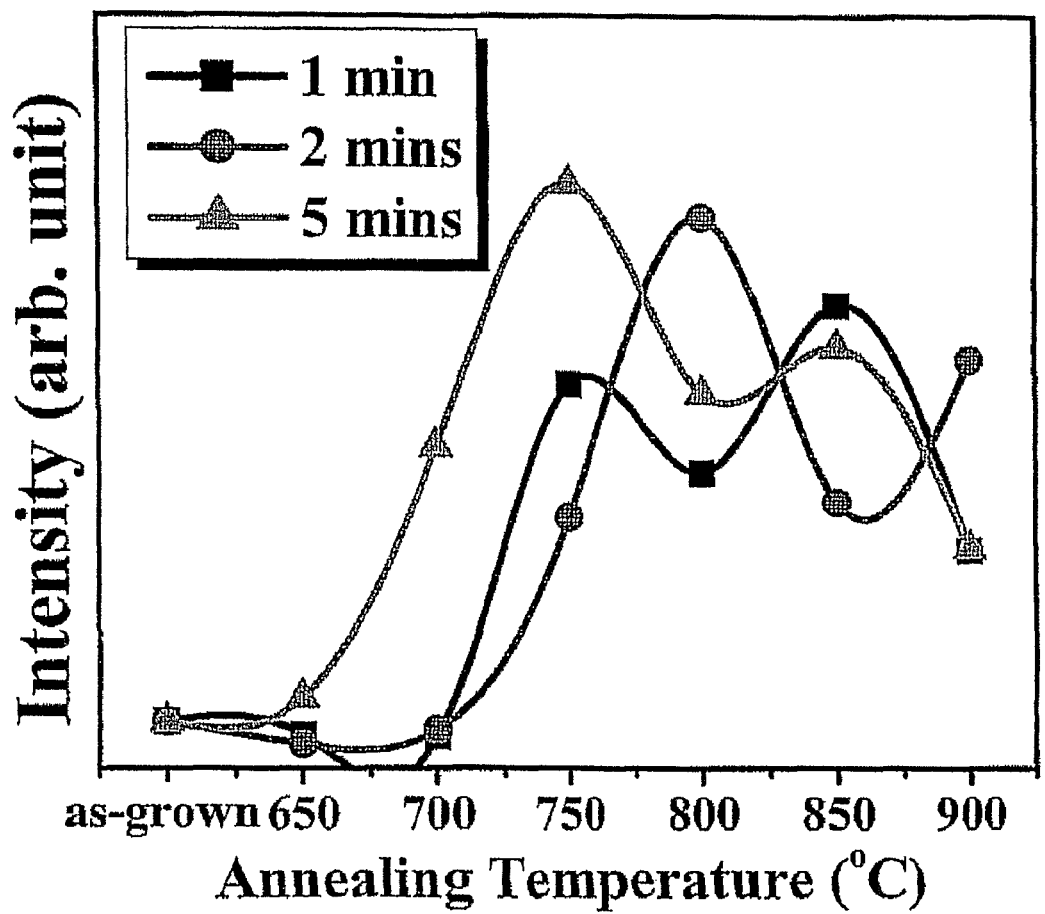
FIG. 8 a schematic representation of a plot of PL peak intensity as a function of ex-situ thermal annealing temperature for an anneal period of 1, 2 and 5 minutes.

Referring now to FIG. 8, a schematic representation of a plot of photoluminescence (PL) peak intensity as a function of ex-situ thermal annealing temperature for an anneal period of 1, 2 and 5 minutes is shown. As can be seen from FIG. 8, the optimum thermal anneal condition is an anneal temperature of about 750° C. for about 5 minutes. Also, significant improvement in photoluminescence is observed on samples annealed at a temperature of greater than about 700° C.

As is evident, there is provided a method for growing GaNAsSb on a substrate based on a nitrogen RF plasma epitaxy process. Advantageously, the method enables a reduction in the formation of defects such as, for example, nitrogen related defects and arsenic antisite defects, in the GaNAsSb material, leading to the realization of high device quality epitaxy layers for electronics and optoelectronics applications. The method may be used to produce high device quality GaNAsSb material on low cost GaAs substrates and eventually on Si substrate by using III-V/Si integration methods. Combined with other group III-V compound semiconductors, the resultant wafers can be applied in the following applications:

(a) Near infrared (wavelength from 1000 nm to 1600 nm) p-i-n photodetector. In particular, GaNAsSb can be used very effectively as the light absorbing layer in the photodetector.

(b) Near infrared (wavelength from 1000 nm to 1600 nm) p-i-n avalanche photodetector. In particular, GaNAsSb can be used very effectively as the light absorbing layer in the photodetector.

(c) High efficiency multi junction solar cell. In particular, GaNAsSb can be used as the light absorbing layer for a solar spectrum below 1.1 eV. This would improve the efficiency of the multi junction solar cell by about 5-10%.

(d) Near infrared (wavelength from 1000 nm to 1600 nm) laser. In particular, GaNAsSb can be used as an active layer in the laser structure.

Figure 9:
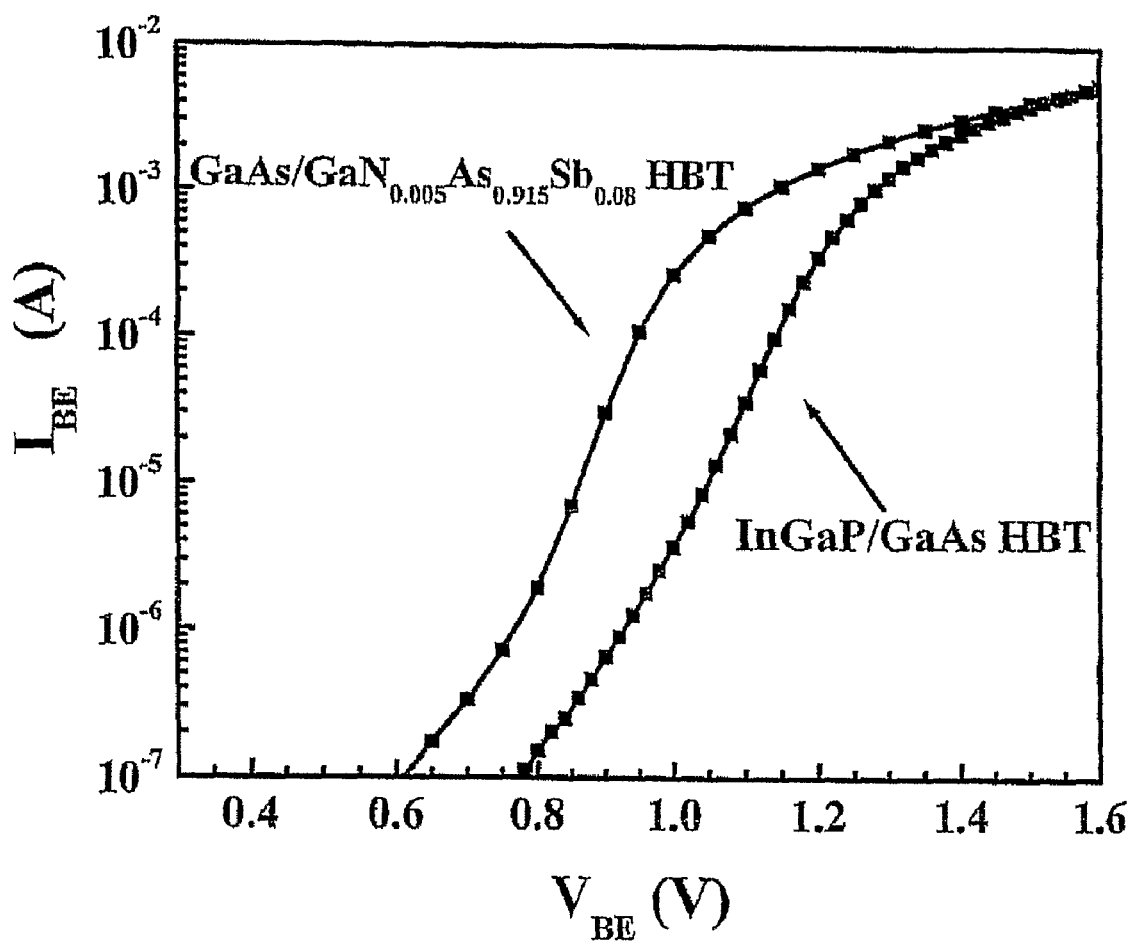
FIG. 9 is a schematic representation of a comparison of turn-on voltage between a GaAs/GaNAsSb heterojunction bipolar transistor and a conventional InGaP/GaAs heterojunction bipolar transistor.

(e) Low turn-on voltage heterojunction bipolar transistor (HBT). In particular, GaNAsSb can be used as a base layer in the transistor, lowering the turn-on voltage as shown in FIG. 9, and thereby lowering power consumption of the transistor.

By adjusting the process parameters such as, for example, fabrication temperature, annealing temperature and annealing time, the following properties of GaNAsSb may be controlled for specific applications:

(i) The bandgap of GaNAsSb may be varied from between about 0.65 eV to about 1 eV to suit a particular application. For instance, in solar cell applications, the atomic concentrations of N (nitrogen) and Sb (antimony) may be adjusted to produce GaNAsSb with a bandgap of 1 eV, while for a high-speed photodetector, the atomic concentrations of N and Sb may be adjusted to produce a GaNAsSb active-layer with bandgap energy of less than about 0.95 eV or 0.8 eV The value depends on the requirements of the application. Bandgap energy of less than 0.8 eV is required for 1.55 μm of wavelength applications. Bandgap energy of less than 0.95 eV is required for 1.3 μm of wavelength applications.

(ii) The carrier lifetime of GaNAsSb: a shorter carrier lifetime is needed for high-speed switching applications, while a longer carrier lifetime is required, for example, for solar cell applications.

(iii) The level of unintentional doping in GaNAsSb. For instance, high-speed photodetector applications are very sensitive to high levels of unintentional doping in the GaNAsSb layer due to the effect of parasitic R-C (resistance-capacitance) on the bandwidth of the detector. Heterojunction bipolar transistor applications, on the other hand, are not affected as much since in such applications, the GaNAsSb layer will be intentionally p-doped.

The following are specific examples of how different GaNAsSb growth parameters may be tailored for different applications:

(a) P-I-N Photodetector

A low level of unintentional doping and low leakage current in the GaNAsSb active layer are required for a high speed and high responsivity photodetector. For such characteristics, the GaNAsSb layer may be grown at 400° C., followed by in-situ annealing at a temperature of about 650° C. for a period of about 30 minutes and thereafter ex-situ annealing at a temperature of about 750° C. for a period of about 5 minutes.

(b) Solar Cell

A longer carrier lifetime is very important for solar cell applications. Thus, an ex-situ annealing step at a temperature of about 750° C. may be used to increase the carrier lifetime.

(c) Ultrafast Sub-picosecond Photodetector

An ultrafast carrier recombination process may be needed for such an application. Thus, the GaNAsSb layer may be grown at a relatively low temperature of less than about 350° C., followed by in-situ annealing at a temperature of about 650° C. for a period of about 30 minutes to achieve fast carrier recombination and a low level of unintentional doping.

No ex-situ annealing is required for such an application.

(d) Avalanche Photodetector

For such an application, a significant amount of As (arsenic) antisite defect is needed to trigger a carrier avalanche process at low voltage. Thus, the growth temperature of GaNAsSb for this application is about 350° C., followed by in-situ annealing at a temperature of about 650° C. for a period of about 30 minutes. No ex-situ annealing is required for such an application.

(e) Heterojunction Bipolar Transistor

The minority carrier lifetime is a critical parameter for this application. The level of unintentional doping is less critical for a transistor application because the GaNAsSb layer is intentionally highly p-doped. Therefore, the growth temperature of the GaNAsSb layer is between about 400 to about 440° C., followed by in-situ annealing at a temperature of about 650° C. for a period of about 30 minutes and thereafter ex-situ annealing at a temperature of about 750° C. for a period of about 5 minutes.

Advantageously, the method may be used to manufacture high speed p-i-n photodetectors with Gigahertz (GHz) high frequency responses.

While the preferred embodiments of the invention have been illustrated and described, it will be clear that the invention is not limited to these embodiments only. Numerous modifications, changes, variations, substitutions and equivalents will be apparent to those skilled in the art without departing from the scope of the invention as described in the claims.

Further, unless the context clearly requires otherwise, throughout the description and the claims, the words "comprise", "comprising" and the like are to be construed in an inclusive as opposed to an exclusive or exhaustive sense; that is to say, in the sense of "including, but not limited to".

The invention claimed is:

1. A method for fabrication of a semiconductor of gallium nitride arsenide antimonide (GaNAsSb) on a substrate wherein the fabrication is performed at a fabrication temperature in the range of 150° C. to 500° C. followed by annealing at an annealing temperature for an annealing time; wherein:
the fabrication temperature is controlled in combination with the annealing temperature or annealing time to control defect formation of nitrogen-related defects and arsenic antisite defects respectively in the semiconductor so as to achieve predetermined performance characteristics of the semiconductor.

2. A method as claimed in claim 1, wherein the density of nitrogen-related defects is reduced with decrease in the fabrication temperature and density of arsenic antisite defects is reduced with increase in the annealing temperature or the annealing time.

3. A method as claimed in claim 1, wherein the defect further includes at least one selected from the group consisting of: surface defects and unintentional doping.

4. A method as claimed in claim 1, further comprising growing epitaxial layers of GaAsSb on a substrate and subjecting the epitaxial layers to exposure of nitrogen atoms from a nitrogen plasma source; wherein the epitaxial layers are isolated from the nitrogen plasma source during plasma ignition.

5. A method as claimed in claim 4, wherein the epitaxial layers are also isolated from nitrogen plasma source during stabilization of the nitrogen plasma source.

6. A method as claimed in claim 4, wherein the nitrogen plasma source is a nitrogen RF-plasma source.

7. A method as claimed in claim 4, wherein isolation is by vacuum isolation using as least one vacuum valve.

8. A method claimed in claim 1, wherein the annealing is selected from the group consisting of in-situ annealing, ex-situ annealing, and in-situ annealing in combination with ex-situ annealing.

9. A method as claimed in claim 8, wherein in-situ annealing has the annealing temperature in the range of 600° C. to 700° C.; and ex-situ annealing has the annealing temperature in the range of 700° C. to 900° C.

10. A method as claimed in claim 8, wherein the annealing time is in the range of 1 to 60 minutes for in-situ annealing, and is in the range of 1 to 10 minutes for ex-situ annealing.

11. A method as claimed in claim 1 further comprising filtering reactive ionic nitrogen species by diversion at a location between the nitrogen plasma source and the substrate.

12. A method as claimed in claim 11, wherein diversion is by applying a field across a plasma tube adjacent an outlet of the nitrogen plasma source, the field being selected from the group consisting of an electrical field and a magnetic field.

13. A method as claimed in claim 12, wherein a voltage is applied across the plasma tube using a pair of deflection plates, the electrical field being substantially perpendicular to a longitudinal axis of the plasma tube.

* * * * *

UNITED STATES PATENT AND TRADEMARK OFFICE
CERTIFICATE OF CORRECTION

PATENT NO. : 8,202,788 B2
APPLICATION NO. : 12/936495
DATED : June 19, 2012
INVENTOR(S) : Soon Fatt Yoon et al.

It is certified that error appears in the above-identified patent and that said Letters Patent is hereby corrected as shown below:

Title Page, Item (54) and Column 1, lines 1-2; Title: "METHOD FOR FABRICATING GANASSB SEMICONDUCTOR" should read -- METHOD FOR FABRICATING GaNAsSb SEMICONDUCTOR --

Signed and Sealed this
Nineteenth Day of February, 2013

Teresa Stanek Rea
*Acting Director of the United States Patent and Trademark Office*